(12) United States Patent
Crawford et al.

(10) Patent No.: US 10,102,886 B2
(45) Date of Patent: *Oct. 16, 2018

(54) TECHNIQUES FOR PROBABILISTIC DYNAMIC RANDOM ACCESS MEMORY ROW REPAIR

(71) Applicant: Intel Corporation, Santa Clara, CA (US)

(72) Inventors: John H. Crawford, Saratoga, CA (US); Brian S. Morris, Santa Clara, CA (US); Sreenivas Mandava, Los Altos, CA (US); Raj K. Ramanujan, Federal Way, WA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/269,657

(22) Filed: Sep. 19, 2016

(65) Prior Publication Data
US 2017/0103795 A1    Apr. 13, 2017

Related U.S. Application Data

(63) Continuation of application No. 14/132,987, filed on Dec. 18, 2013, now Pat. No. 9,449,671.

(60) Provisional application No. 61/791,205, filed on Mar. 15, 2013.

(51) Int. Cl.
  G11C 7/02      (2006.01)
  G06F 13/16     (2006.01)
  G11C 11/406    (2006.01)

(52) U.S. Cl.
  CPC ............ *G11C 7/02* (2013.01); *G06F 13/1636* (2013.01); *G11C 11/40611* (2013.01); *Y02D 10/14* (2018.01)

(58) Field of Classification Search
  CPC .................. G06F 13/1636; G11C 7/02; G11C 11/406–11/40626
  USPC ....................................................... 711/106
  See application file for complete search history.

(56) References Cited

U.S. PATENT DOCUMENTS 9,449,671 B2 *   9/2016   Crawford .............. G11C 11/406
2014/0146624 A1 *  5/2014   Son ..................... G11C 29/4401
                                                   365/200

* cited by examiner

*Primary Examiner* — Nathan Sadler (57) ABSTRACT

Examples are disclosed for probabilistic dynamic random access memory (DRAM) row repair. In some examples, using a row hammer limit for DRAM and a maximum activation rate for the DRAM a probabilistic row hammer detection value may be determined. The probabilistic row hammer detection value may then be used such that a probability is acceptably low that a given activation to an aggressor row of the DRAM causes the row hammer limit to be exceeded before a scheduled row refresh is performed on one or more victim rows associated with the aggressor row. Other examples are described and claimed.

23 Claims, 7 Drawing Sheets

*FIG. 1*

FIG. 2A — Sequences 210

FIG. 2B — Sequences 220

FIG. 2C — Sequences 230

FIG. 2D — Sequences 240

RECEIVE, AT CIRCUITRY FOR A MEMORY CONTROLLER, INFORMATION TO INDICATE A ROW HAMMER LIMIT FOR DRAM HAVING A GIVEN MAXIMUM ACTIVATE RATE TO DRAM ROWS
602

DETERMINE A PROBABILISTIC ROW HAMMER DETECTION VALUE THAT SELECTS A GIVEN ACTIVATION TO A GIVEN AGGRESSOR ROW FROM AMONG THE DRAM ROWS FOR A pTRR TO ONE OR MORE VICTIM ROWS ASSOCIATED WITH THE GIVEN AGGRESSOR ROW BASED ON A FIRST PROBABILITY THAT THE GIVEN ACTIVATION CAUSES THE ROW HAMMER LIMIT TO BE EXCEEDED FOR THE GIVEN AGGRESSOR ROW BEFORE A SCHEDULED ROW REFRESH IS PERFORMED ON THE ONE OR MORE VICTIM ROWS
604

GENERATE A RANDOM NUMBER VIA A RANDOM NUMBER GENERATOR FOLLOWING A FIRST ACTIVATION TO A FIRST AGGRESSOR ROW
606

COMPARE THE GENERATED RANDOM NUMBER TO AN EXPECTED NUMBER
608

SEND A FIRST pTRR TO ONE OR MORE VICTIM ROWS ASSOCIATED WITH THE FIRST AGGRESSOR ROW BASED ON THE COMPARISON SUCH THAT SEPARATE pTRRS TO A MULTITUDE OF VICTIM ROWS ASSOCIATED WITH RESPECTIVE AGGRESSOR ROWS ARE SENT AT AN AVERAGE ACTIVATE RATE FOR THE RESPECTIVE AGGRESSORS THAT APPROXIMATELY EQUALS THE PROBABILISTIC ROW HAMMER DETECTION VALUE
610

*FIG. 6*

Storage Medium 700

*Computer Executable Instructions for 600*

FIG. 7

Computing Platform 800

*Processing Component 740*
*Apparatus 500*
*Storage Medium 700*

*Other Platform Components 850*

*Communications Interface 860*

FIG. 8

TECHNIQUES FOR PROBABILISTIC DYNAMIC RANDOM ACCESS MEMORY ROW REPAIR

RELATED CASE

This application is a continuation of, claims the benefit of and priority to previously filed U.S. Pat. No. 9,449,671 that issued on Sep. 20, 2016, filed Dec. 18, 2013, entitled "Techniques for Probabilistic Dynamic Random Access Memory Row Repair", which is claims priority to U.S. Provisional Patent Application No. 61/791,205, filed on Mar. 15, 2013; both of which are incorporated herein by reference in their entirety.

TECHNICAL FIELD

Examples described herein are generally related to memory access to dynamic random access memory.

BACKGROUND

As dynamic random access memory (DRAM) technologies are scaled to smaller dimensions, reliability issues arise that require mitigation by careful design. One such issue is the noise or disturbance injected into neighboring cells when a row is activated and refreshed repeatedly. The voltage swings and current driven when a row (called the aggressor) is activated or refreshed can inject noise into neighboring cells (victims), potentially draining a little bit of charge from the victim's storage capacitors. The more often the aggressor row is activated before its victim neighbors are activated or refreshed, and the weaker the victim cells (smaller charge, higher leakage, etc.), the higher the probability that one or more cells in the victim row will flip and thus may cause data corruption. The multiple activates to an aggressor row is typically referred to as row hammer.

DETAILED DESCRIPTION

As contemplated in the present disclosure, as DRAM may scale to greater densities having smaller transistor gate widths, a high number of activates to a single row of a DRAM within a refresh window may increase a potential for corruption of data in adjacent or victim rows. These multiple activates, as mentioned previously, may be referred to as a row hammer. In some examples, the number of row hammers necessary to cause an error in a victim row may be referred to as the DRAM's "row hammer limit". In some memory systems (controller plus DRAMs), in order to reduce the probability of data corruption a method may be implemented to either: a) avoid going over the row hammer limit in between periodic refreshes to the victim rows (e.g., every 64 milliseconds (ms); or b) detect when the row hammer limit is about to be exceeded and then cause a targeted read refresh (TRR) to be sent to the victim rows outside of the periodic refreshes.

In the past, DRAMs may have been manufactured with a row hammer limit that was essentially the maximum number of activates that could be driven in between periodic refreshes that were typically 64 ms. Unfortunately, as DRAM technology scaled below the 40 nanometer generation and DRAM access rates greatly increased, the row hammer tolerance for DRAMs dropped dramatically and a probability of reaching a row hammer limit between period refreshes also increased.

Some methods have been developed to avoid or detect and refresh, as noted above. Other methods have also been developed to increase the periodic refresh rate to 2×, 4×, or whatever is required to ensure that a victim row is refreshed before a row hammer limit is exceeded under given operating scenarios. These other methods may have a minimal impact on controller logic for a DRAM memory controller, but may have a large performance and power impact in a memory system. It is with respect to these and other challenges that the examples described herein are needed.

In some examples, information to indicate a row hammer limit for dynamic random access memory (DRAM) having a given activate rate to DRAM rows may be received at circuitry for a memory controller. For these examples, a probabilistic row hammer detection value that selects an activation to an aggressor row from among the DRAM rows that causes a pseudo targeted row refresh (pTRR) to one or more victim rows associated with the aggressor row may be determined. The probabilistic row hammer detection value may be determined based on a first probability that the activation causes the row hammer limit to be exceeded for the aggressor row before a scheduled row refresh is performed on the one or more victim rows.

According to some examples, a random number may be generated via a random number generator. The random number may be generated following a first activation to a first aggressor row. A comparison may then be made between the random number and an expected number. A first pTRR may then be sent to one or more victim rows associated with the first aggressor row based on the comparison such that separate pTRRs to a multitude of victim rows associated with respective aggressor rows may be sent at an average activate rate for the respective aggressors that approximately equals the probabilistic row hammer detection value determined as mentioned above.

Figure 1:
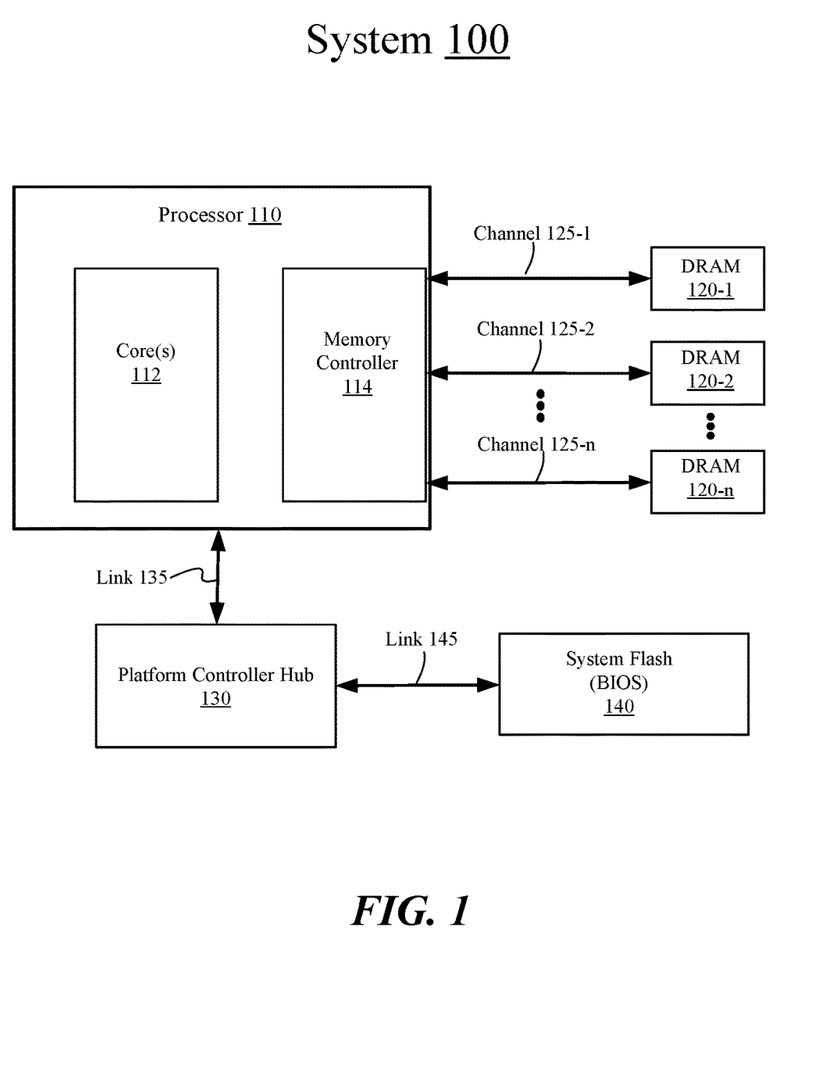
FIG. 1 illustrates an example first system.

FIG. 1 illustrates an example first system. As shown in FIG. 1, the first system includes system 100. In some examples, system 100 may include a processor 110, a platform controller hub 130, a system flash 140 or DRAMs 120-1 to 120-$n$, where "n" is any positive whole integer greater than 2. Also, as shown in FIG. 1, DRAMs 120-1 to 120-$n$ may couple to processor 110 via respective channels 125-1 to 125-$n$.

According to some examples, as shown in FIG. 1, processor 110 may include core(s) 112 and a memory controller 114. For these examples, memory controller 114 may include logic and/or features to serve as an integrated memory controller for processor 110. As the integrated memory controller for processor 110, memory controller 114 may facilitate read or write access to DRAMs 120-1 to 120-$n$ for elements of processor 110 such as core(s) 112.

In some examples, system flash 140 may be capable of storing a basic input output system (BIOS). For these examples, during system boot of system 100, the BIOS may be forwarded via communication link 145 to platform controller hub 130 and then to core(s) 112 via link 135. The BIOS may include software instructions to be executed by core(s) 112 as at least a part of the system boot.

According to some examples, DRAMs 120-1 to 120-n may or may not be on separate dual in-line memory modules (DIMMs) each having a plurality of DRAM chips. The DIMMs may include various types of DRAM such as double data rate synchronous DRAM (DDR SDRAM) as described in one or more technical standards or specifications to include those published by the JEDEC Solid State Technology Association ("JEDEC") for various generations of DDR such as DDR2, DDR3, DDR4 or future DDR generations. The DIMMs may be arranged in various configurations to include, but are not limited to, register DIMMs (RDIMMs), load reduced DIMMs (LRDIMMs), unregistered DIMMs (UDIMMs) or fully buffered DIMMs (FB-DIMMs). These various configurations may also be described in one or more technical standards published by JEDEC.

In some examples, DRAMs 120-1 to 120-n, depending on the generation of DDR and DIMM configuration, may have a given maximum activation rate for memory controller 114 to perform a read/write transactions to DRAMs 120-1 to 120-n via respective channels 125-1 to 125-n. The given maximum activation may be based on various factors such as a generation of DDR, type of DIMM configuration or a frequency for data and strobe frequencies associated with address and control of DRAMs 120-1 to 120-n. For example, a DDR3 DIMM may have a 1333 megahertz (MHz) data and strobe frequency that has a maximum activation rate of approximately 10,600,000 activations per 64 ms row refresh period for each channel of channels 125-1 to 125-n. Other types of DIMMs having other generations of DDR may have slower or faster data and strobe frequencies that may result in a higher or lower maximum activation rate. Also, row refresh periods other than 64 ms are contemplated. Examples are not limited in this context.

In some examples, DRAMs 120-1 to 120-n may separately or jointly include operating parameter information in a serial presence detect (SPD) table maintained at or with DRAMs 120-1 to 120-n (not shown). The SPD table may include information to determine a maximum activation rate and/or a row hammer limit for which DRAMs 120-1 to 120-n may be configured to operate under. For example, the SPD table for DRAMs 120-1 to 120-n may indicate a data and strobe frequency of 1333 MHz having a maximum activation rate of 10.6 million activates per 64 ms row refresh period for each DRAM. The SPD table may also indicate a row hammer limit of 250,000 row hammers per 64 ms row refresh period.

In some examples, as described in more detail below, logic and/or features at memory controller 114 may have access to the above-mentioned information maintained in the SPD table. The logic and/or features at memory controller 114 may use the maximum activation rate as well as the row hammer limit indicated for DRAMs 120-1 to 120-n to determine a probabilistic row hammer detection value. This determined probabilistic row hammer detection value may be used to select a given activation to a given aggressor row in one of DRAMs 120-1 to 120-n for a pTRR to one or more victim rows from among DRAM rows associated with the given aggressor row.

According to some examples, every time memory controller 114 issues a transaction, there is a probability '1-in-P', where "P" equates to the probabilistic row hammer detection value, that memory control 114 may clean up victim rows physically adjacent to the aggressor row of the original transaction. For these examples, P may be determined such that a likelihood of not cleaning the victim rows before reaching a given row hammer limit for DRAMs 120-1 to 120-n may be very small. In some examples, for row hammer limits around 250,000, the P may be set low enough to have a very small impact on performance and power usage by DRAMs 120-1 to 120-n. In other words, pTRRs to victim rows may be sent at a rate based on P that may have a relatively small impact on performance and power usage as compared to just shortening a scheduled row refresh period to reduce risks of reaching the row hammer limit.

In some examples, a probability of missing a TRR to a victim row before reaching a row hammer limit for DRAMs 120-1 to 120-n is important for determining P. This probability may be determined via use of example equation (1):

$$Probability_{RowHammer} = \left(1 - \frac{1}{P}\right)^T \quad \text{Example equation (1)}$$

For example equation (1), T=row hammer limit and P=row hammer probabilistic row hammer detection value.

According to some examples, an activate (ACT) may be viewed as a series of activates to a variety of DRAM addresses and banks, or as a sequence of activates to a single address, possibly separated by activates to other addresses, reads, writes, refreshes, etc. Consider a sequence of ACTs to a same address. This is why it may be important to determine whether to send a pTRR at every ACT due to a need to have a small probability of picking any ACT to refresh adjacent rows. Note that this determination may not distinguish ACT sequences that may be interrupted by refreshes (of victim rows), so this gives an upper bound.

According to some examples, Table I below shows probabilities of missing a TRR to a victim row before reaching a row hammer limit using example equation (1) and various values of T and P.

TABLE I

| T = | P = 4,096 | P = 2,048 | P = 1,365 | P = 1,024 |
|---|---|---|---|---|
| 250,000 | 3.1E−27 | 9.39E−54 | 2.69E−80 | 8.30E−107 |
| 175,000 | 2.8E−19 | 7.6E−38 | 2.00E−56 | 5.54E−75 |
| 125,000 | 5.6E−14 | 3.06E−27 | 1.64E−40 | 9.11E−54 |
| 75,000 | 1.11E−08 | 1.24E−16 | 1.34E−24 | 1.50E−32 |
| 50,000 | 4.99E−06 | 2.48E−11 | 1.22E−16 | 6.08E−22 |
| 25,000 | 2.23E−03 | 4.98E−06 | 1.104E−08 | 2.47E−11 |

In some examples, as shown in Table I, for T=25,000 and P=4,096 a first probability of missing a TRR is relatively high. Meanwhile for T=250,000 and P=1,024 a second probability of missing a TRR is extremely low. So raising the hammer limit or lowering the value for a probabilistic row hammer detection value may reduce a given probability of missing a TRR to a victim row for a given ACT to an aggressor row. However, higher values for T are more difficult to accomplish for DRAMs having increasingly dense configurations. This may raise costs associated with manufacturing DRAMs that can accomplish higher values for T. Also, low values for P may result in higher energy usage and some performance degradation.

According to some examples, as described more below, a billion-hour failure in time (FIT) rate may be used as a metric to determine an acceptable value for the probabilistic row hammer detection value that may result in a balance between having a value for T that is more easily accomplished yet also having a value for P that minimizes energy usage and performance degradation.

Figure 2A:
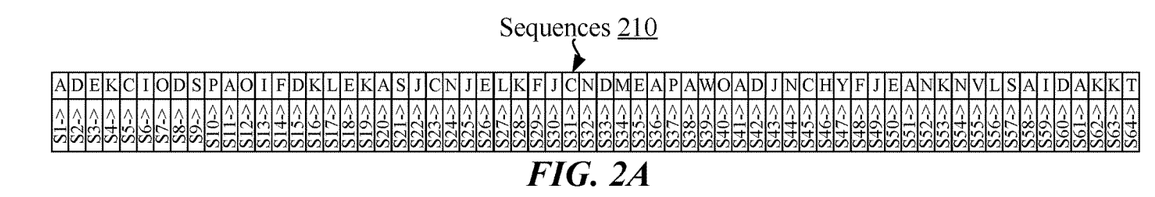
FIGS. 2A-2D illustrate example sequences.
Figure 2B:
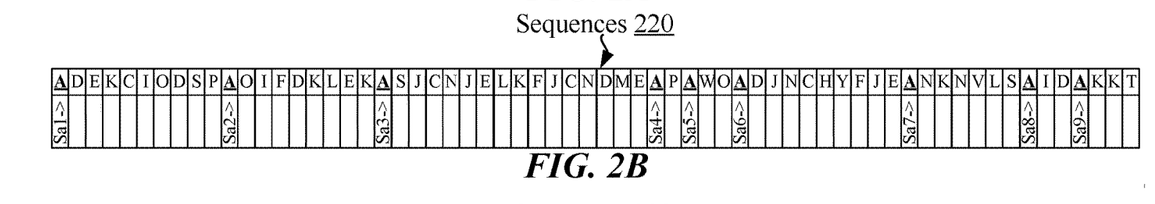

FIGS. 2A-2D illustrate example sequences 210 to 240. In some examples, sequences 210 to 240 may represent a sequence of ACTS to various row addresses of one or more DRAMs (e.g., DRAMs 120-1 to 120-n). For example, FIG. 2A illustrates sequences 210 that has 64 separate sequences for ACTs to different row addresses. Each row address may be represented by different letters. For sequences 210, each sequence to a given row may represent a total number of ACTs to the given row that equals the hammer limit or T for the one or more DRAMs. This may ignore periodic or scheduled row refreshes (as they refresh victim rows) to simplify a determination of an upper bound on a billion-hour FIT rate for the one or more DRAMs. The jumbled nature of the ACTs for sequences 210 to the various addresses may complicate the determination of a billion-hour FIT rate. However, sequences 220 in FIG. 2B show 9 separate sequences of separate T ACTs to a given row address and that row address is row A. So sequences 220 depict that a first sequence (marked as Sa1) continues, for example, until a pTRR is sent to one or more victim rows associated with row A (e.g., row B) and the second sequence starts with the $2^{nd}$ row A sequence (marked as Sa2) and also continues until another pTRR is sent to the one or more victim rows, and so on. As a result, a collection of overlapping series of ACTs to the same address is included in sequences 220. Each one of these sequences may be considered in the billion-hour FIT rate determination.

Figure 2C:
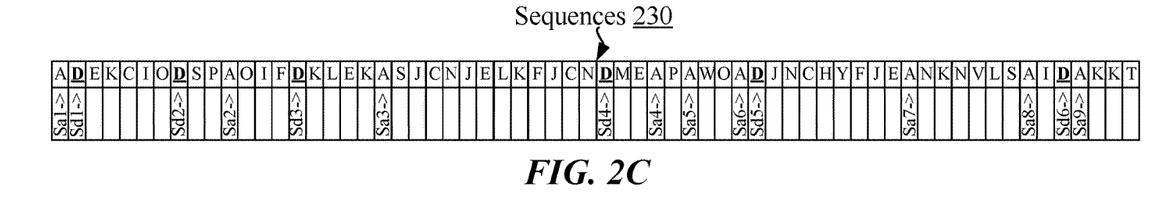

In some examples, FIG. 2C shows sequences 230 that add 6 separate sequences of separate T ACTs to row D as well as the 9 separate sequences of separate T ACTs to row A. Similar separate sequences could also be shown for other rows as well.

Figure 2D:
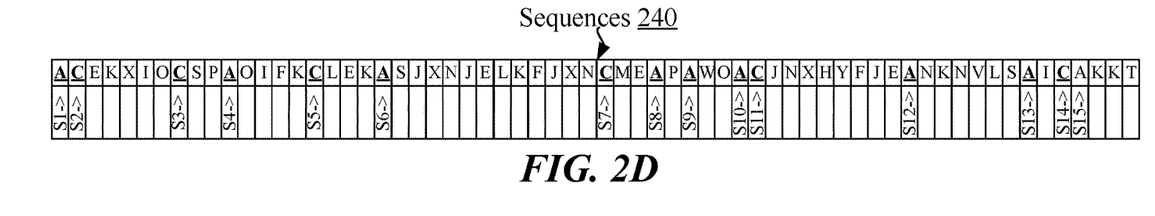

According to some examples, FIG. 2D shows separate sequences for rows A and C that may be aggressor rows to row B that may lead to double-hammering to row B. However, rather than cutting a row hammer limit by a factor of 2 to address double-hammering, a consideration of sequences for either row A or row C may be made when determining the billion-hour FIT rate as a pTRR for either aggressor row will be sent to victim row B.

Figure 3:
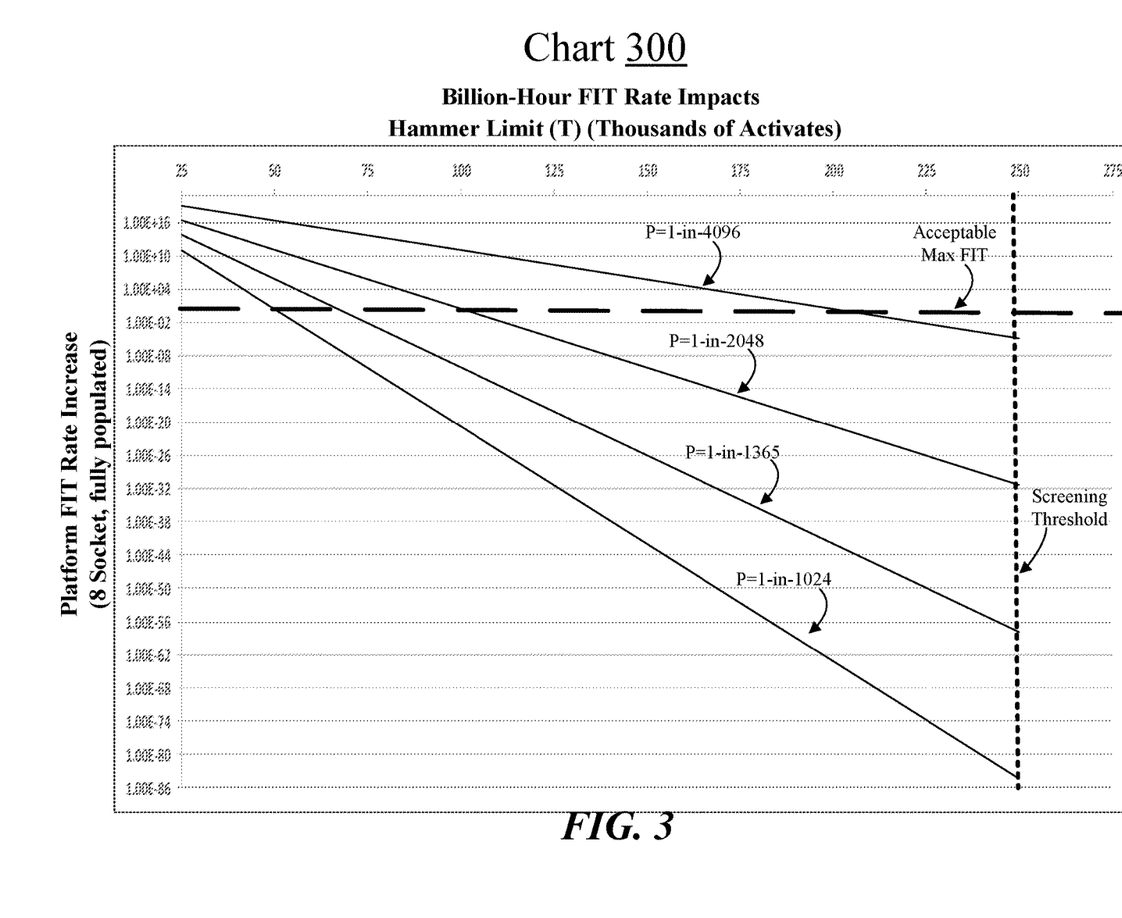
FIG. 3 illustrates an example chart.

FIG. 3 illustrates an example chart 300. In some examples, as shown in FIG. 3, chart 300 depicts various billion-hour FIT rate impacts based on values for T and P. In some examples, the billion-hour FIT rate may be for a memory system having 8 DDR3 DIMM modules having DRAMs designed to have a given T. Also, each DIMM module may have a activate rate to DRAM rows of 10.6 million activates per 64 ms row refresh period per channel (e.g., a maximum activate rate). So the total activate rate for the memory system may be 84.8 million activates per 64 ms row refresh period. For chart 300, the billion-hour FIT rates may be determined based on first multiplying the probabilities shown in Table I by the maximum number of activates possible over each 64 ms row refresh period, then multiply by 3600/0.064 to determine per-hour FIT rates and then multiply by 1,000,000,000 to determine the billion-hour FIT rates.

Table II shows the billion-hour FIT rate values plotted in chart 300 for various values for T and P.

TABLE II

| T = | P = 4,096 | P = 2,048 | P = 1,365 | P = 1,024 |
|---|---|---|---|---|
| 250,000 | 1.47E−05 | 4.48E−32 | 1.28E−58 | 3.96E−85 |
| 125,000 | 2.65E08 | 1.46E−05 | 7.82E−19 | 4.35E−32 |

TABLE II-continued

| T = | P = 4,096 | P = 2,048 | P = 1,365 | P = 1,024 |
|---|---|---|---|---|
| 75,000 | 5.31E13 | 5.89E5 | 6.41E−03 | 7.15E−11 |
| 25,000 | 1.07E09 | 2.38E16 | 5.27E13 | 1.18E11 |

The FIT rates shown in Table II and plotted in chart 300 may be for a memory system having DDR3 DIMMs running at a maximum potential for row hammer stress, 24×7, with max activation in every channel between the DRAMs and a memory controller. The "failure" calculated by these FIT rates does not imply a system failure, it indicates that a hammer sequence longer than the specified sequence may slip through the probability net casted using a given probabilistic row hammer detection value "P" for DRAMs having a given row hammer limit "T" if the FIT rate falls below a value of 1. For example, for a P value of 4096, according to chart 300 and Table II, T values less than 250,000 may not have acceptable FIT rates and some row hammer errors may result using a P value of 4096. However, for P values of 1024 or 1365, T values as low as 75,000 would still have acceptable FIT rates that fall below a value of 1.

According to some examples, logic and/or features at a memory controller for the system may adjust values used for P to ensure the billion-hour FIT rate falls below a value of 1. As a result, the memory controller may select a highest possible value for P for a given value of T that still has a billion-hour FIT rate less than one. For example, the memory controller may select a P value of 2048 for a T value of 125,000. As shown in FIG. 3, the P value of 2048 for the T value of 125,000 has a FIT rate that falls closest to a value of 1 without going over that value.

Figure 4:
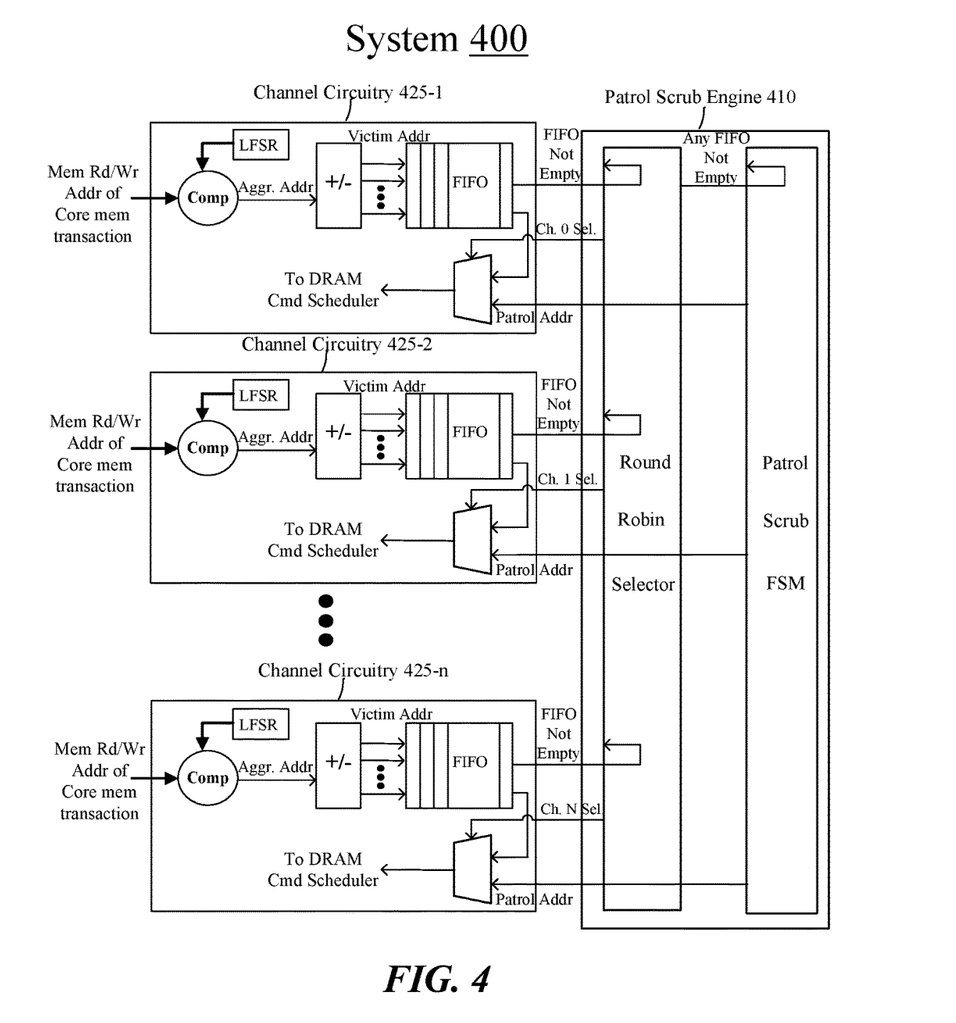
FIG. 4 illustrates an example second system.

FIG. 4 illustrates an example second system. As shown in FIG. 4 the second system may include system 400. In some examples, as shown in FIG. 4, system 400 includes a patrol scrub engine 410 coupled to channel circuitry 425-1 to 425-n. According to some examples, system 400 may be part of an integrated memory controller controlling DIMMs having DRAM similar to memory controller 114 receiving memory read/write addresses of core memory transaction to one or more cores similar to core(s) 112 of processor 110 for a computing system having a BIOS.

In some examples, patrol engine 410 and channel circuitry 425-1 to 425-n may be implemented to issue patrol scrubs (to correct possible errors in memory) at an increased rate to account for a probability of injecting a pTRR to one or more victim rows associated with aggressor rows in one or more DIMMs. The increased rate may be in addition to satisfying possible requirements to send a patrol scrub to every memory address associated with DRAM included in the one or more DIMMs every 24 hours. Two scrub intervals may be calculated independently and combined according to example equation (2) to find a final scrub interval.

$$ScrubInterval_{Combined} = \frac{1}{\left[\frac{1}{ScrubInterval_{Patrol}} + \frac{1}{ScrubInterval_{RowHammer}}\right]} \quad \text{Example equation (2)}$$

For example equation (2), $ScrubInterval_{Patrol}$ may be programmed or calculated by the BIOS for the computing system. In some examples, a register maintained at the memory controller may be programmed with a value determined using example equation (2).

According to some examples, a patrol rate for exclusively preventing row hammer errors may be calculated using example equation (3).

$$ScrubInterval_{RowHammer} = P \times \frac{4}{\#pTRR \times \#channels} \quad \text{Example equation (3)}$$

For example equation (3), #channels may be the number of populated channels coupled to the one or more DIMMs. Also, for example equation (3), #pTRR may be 2 for DIMMs configured as UDIMMs and 4 for DIMMs configured as RDIMMs or LRDIMMs.

seed may be programmed for two lockstep channels. According to some examples, processor firmware or the BIOS may periodically read the DRNG register to periodically re-seed the LFSR.

According to some examples, two 15-bit thresholds may be programmed to control the prediction of a given LFSR. A 15-bit mask (per bit for each of the 15 bits in the threshold) can be programmed to change a number of bits to compare. An evaluation where either threshold, if enabled, matches the value in the lowest 15 bits of the LFSR triggers the injection of victim addresses to respective first in, first out (FIFOs) for a respective channel circuitry. The evaluation is shown in Table III below.

TABLE III

| | rdln_ctl_threshold0 | | | | rdln_ctl_threshold1 | | | |
| --- | --- | --- | --- | --- | --- | --- | --- | --- |
| P= | rdln_thrshld0_enable | #bits | rdln_thrshld0_mask | rdln_thrshld0 | rdln_thrshld1_enable | #bits | rdln_thrshld1_mask | rdln_thrshld1 |
| 16 | 1 | 4 | 0x7FF0 | 0x10AB | 0 | X | X | X |
| 32 | 1 | 5 | 0x7FE0 | 0x10AB | 0 | X | X | X |
| 64 | 1 | 6 | 0x7FC0 | 0x10AB | 0 | X | X | X |
| 128 | 1 | 7 | 0x7F80 | 0x10AB | 0 | X | X | X |
| 256 | 1 | 8 | 0x7F00 | 0x10AB | 0 | X | X | X |
| 512 | 1 | 9 | 0x7E00 | 0x10AB | 0 | X | X | X |
| 683 | 1 | 11 | 0x7800 | 0x10AB | 1 | 10 | 0x7C00 | 0x10F8 |
| 819 | 1 | 12 | 0x7000 | 0x10AB | 1 | 10 | 0x7C00 | 0x10F8 |
| 910 | 1 | 13 | 0x6000 | 0x10AB | 1 | 10 | 0x7C00 | 0x10F8 |
| 964 | 1 | 14 | 0x4000 | 0x10AB | 1 | 10 | 0x7C00 | 0x10F8 |
| 993 | 1 | 15 | 0x0000 | 0x10AB | 1 | 10 | 0x7C00 | 0x10F8 |
| 1024 | 1 | 10 | 0x7C00 | 0x10AB | 0 | X | X | X |
| 1365 | 1 | 12 | 0x7000 | 0x10AB | 1 | 11 | 0x7800 | 0x10F8 |
| 1638 | 1 | 13 | 0x6000 | 0x10AB | 1 | 11 | 0x7800 | 0x10F8 |
| 1820 | 1 | 14 | 0x4000 | 0x10AB | 1 | 11 | 0x7800 | 0x10F8 |
| 1928 | 1 | 15 | 0x0000 | 0x10AB | 1 | 11 | 0x7800 | 0x10F8 |
| 2048 | 1 | 11 | 0x7800 | 0x10AB | 0 | X | X | X |
| 2731 | 1 | 13 | 0x6000 | 0x10AB | 1 | 12 | 0x7000 | 0x10F8 |
| 3277 | 1 | 14 | 0x4000 | 0x10AB | 1 | 12 | 0x7000 | 0x10F8 |
| 3641 | 1 | 15 | 0x0000 | 0x10AB | 1 | 12 | 0x7000 | 0x10F8 |
| 4096 | 1 | 12 | 0x7000 | 0x10AB | 0 | X | X | X |
| 5461 | 1 | 14 | 0x4000 | 0x10AB | 1 | 13 | 0x6000 | 0x10F8 |
| 6554 | 1 | 15 | 0x0000 | 0x10AB | 1 | 13 | 0x6000 | 0x10F8 |
| 8192 | 1 | 13 | 0x6000 | 0x10AB | 0 | X | X | X |
| 10923 | 1 | 15 | 0x0000 | 0x10AB | 1 | 14 | 0x4000 | 0x10F8 |
| 16384 | 1 | 14 | 0x4000 | 0x10AB | 0 | X | X | X |
| 32768 | 1 | 15 | 0x0000 | 0x10AB | 0 | X | X | X |

In some examples, P is determined based on a row hammer limit (T) for the DIMMs and the activate rate as mentioned above. According to some examples, if T is 250,000 then an expected safe initial setting (e.g., meets a 1-billion hour FIT rate) may be P=4096.

According to some examples, as shown in FIG. 4, channel circuitry 425-1 to 425-n may each have a linear feedback shift register (LFSR) to generate a pseudo random number. For example, each LFSR may be 63 bits long, with a primitive polynomial of $x^{63}+x^{62}+1$. Each LFSR may clock for every valid command injected into the channel by the memory controller to control DRAM included in the one or more DIMMs. Although not shown in FIG. 4, in other examples, all channel circuitry may share a single LFSR.

In some examples, a processor that executes the BIOS for the computing system may read a random number from a Digital Random Number Generator (DRNG) register (not shown) as part of a reset sequence and may use the random number from the DRNG register to seed each LFSR. The same seed may be programmed for LFSRs, and the same A pseudo-code is shown below for the evaluation using Table III:

Step LFSR;
If (OR (0=ANDNOT(XOR(LFSR, rdln_thrshld0), rdln_thrshld0_mask),
(0=ANDNOT(XOR(LFSR, rdln_thrshld1), rdln_thrshld1_mask))
THEN {emit pTRR sequence}

For the above pseudo-code, a comparison to a respective LFSR is via an "equal to" operation, rather than a "less than" operation. A less than operation does not work well with the pattern of random numbers that may be generated by the respective LFSR; a "less than" operation inherently places little significance on the least significant bits. Since a given LFSR value at time N is nearly the same value as time N−1 (only shifted by 1), a hit in cycle N−1 will have a 50% chance of also hitting in cycle N. This may lead to a clustering of hits that is undesirable.

In some examples, note that it may be possible to guarantee a minimum distance between "hits" on the equal-to comparison to the respective LFSR by a careful choice of values for RDLN_CTL_THRESHOLDN.rdln_thrshldN. Due to the shifting nature of an LFSR, a '01' pattern in rdln_thrshldN may guarantee at least 1 cycle between hits, a '001' pattern in rdln_thrshldN may guarantee at least 2 cycles between hits, etc. Note that if both rdln_ctl_threshold0 and rdln_ctl_threshold1 are used, the pattern must be in both rdln_thrshld0 & rdln_thrshld1 in bit positions that are not masked out by rdln_thrshld0_mask & rdln_thrshld1_mask.

According to some examples, logic and/or features located at or with channel circuitry 425-1, 425-2, 425-n or patrol scrub engine 410 may be capable of causing respective LFSRs to generate a random number following a first activation to an aggressor row of DRAM included in the one or more DIMMs. For these examples, the logic and/or features may compare the generated random number to an expected random number (e.g., using the above pseudocode). The logic and/or features may then be capable of causing a pTRR to be sent to one or more victim rows associated with the aggressor row based on the comparison such that separate pTRRs to a multitude of victim rows associated with respective aggressor rows are sent at an average activate rate for the respective aggressors that approximately equals the value for P (probabilistic row hammer detection value). For these examples, the value for P may have been used to determine ScrubInterval$_{RowHammer}$ as mentioned above.

In some other examples, logic and/or features located at or with channel circuitry 425-1, 425-2, 425-n or patrol scrub engine 410 may be capable of causing respective LFSRs to generate random numbers such that the random number is generated around a median value that maintains a minimum interval between sending subsequent pTRRs to victim rows associated with given aggressor rows.

In some other examples, logic and/or features located at or with channel circuitry 425-1, 425-2, 425-n or patrol scrub engine 410 may be capable of decrementing the generated random number for each subsequent activation to any aggressor rows until the random number is decremented to zero. For these examples, the logic and/or features may be capable of selecting a given aggressor row from among the subsequent activation(s) that causes the random number to be decremented to zero. The logic and/or features may then be capable of causing a pTRR to be sent to one or more victim rows associated with the given aggressor row.

According to some other examples, logic and/or features located at or with channel circuitry 425-1, 425-2, 425-n or patrol scrub engine 410 may be capable of determining, responsive to an activation to an aggressor row, a total number of separate activations to any aggressor row for the DRAM included in the one or more DIMMs following sending of a last pTRR to any victim row(s). For these examples, the logic and/or features may be capable of comparing the total number to the value of P used to determine ScrubInterval$_{RowHammer}$ as mentioned above. The logic and/or features may then be capable of causing a pTRR to be sent to one or more victim rows associated with the aggressor based on the total number matching the value for P.

Figure 5:
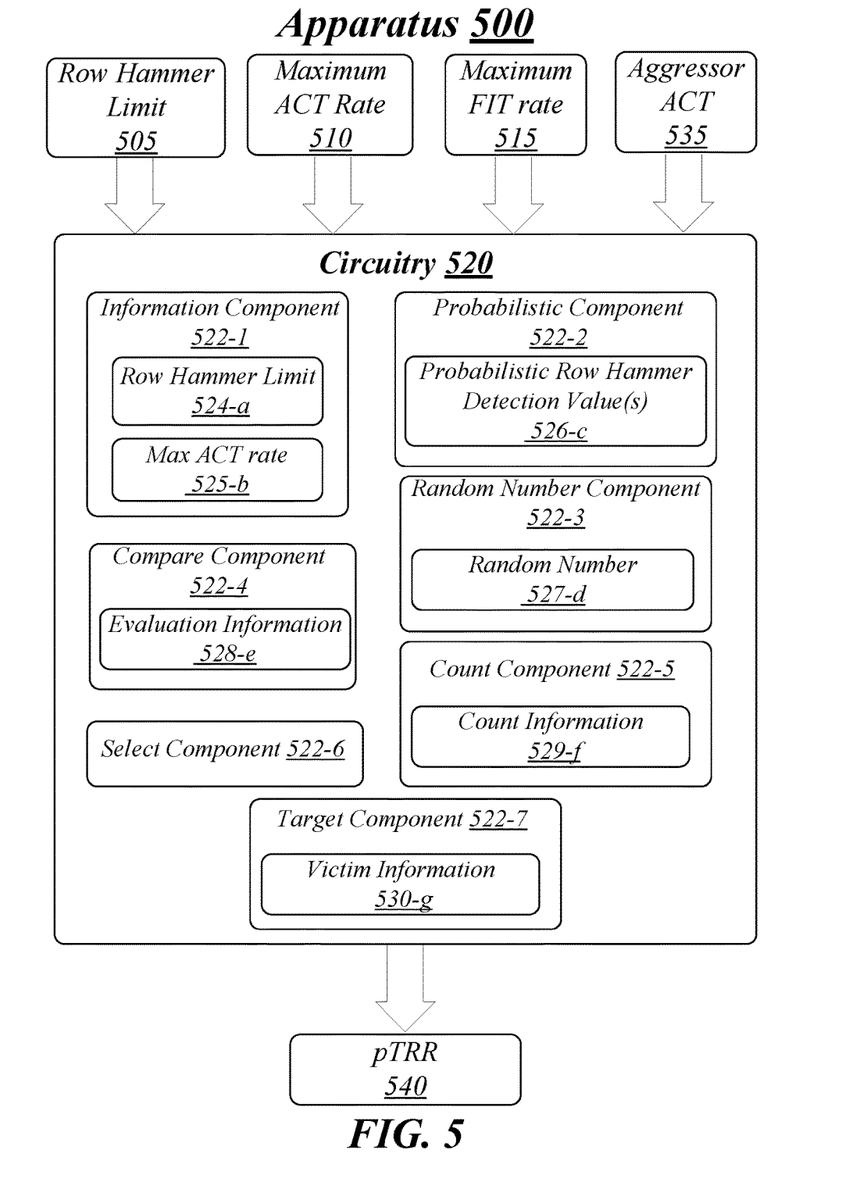
FIG. 5 illustrates an example apparatus.

FIG. 5 illustrates an example apparatus 500. Although the apparatus 500 shown in FIG. 5 has a limited number of elements in a certain topology, it may be appreciated that the apparatus 500 may include more or less elements in alternate topologies as desired for a given implementation.

The apparatus 500 may comprise a computer-implemented apparatus that may be used to determine a probabilistic row hammer detection value "P" and cause pTRRs to be sent to victim rows of DRAM as mentioned above for FIGS. 1-4. The computer-implemented apparatus 500 may be arranged to execute one or more software components 522-a. It is worthy to note that "a" and "b" and "c" and similar designators as used herein are intended to be variables representing any positive integer. Thus, for example, if an implementation sets a value for a=7, then a complete set of software components 522-a may include components 522-1, 522-2, 522-3, 522-4, 522-5, 522-6 or 522-7. The examples are not limited in this context.

According to some examples, apparatus 500 may be capable of being located with a processor such as processor 110 (e.g., included in memory controller 114). For these examples, apparatus 500 may be included in or implemented by at portions of the processor's circuitry. In other examples, apparatus 500 may be implemented as part of firmware for a memory controller coupled to a processor. The examples are not limited in this context.

In some examples, if apparatus 500 is implemented as part of a processor, the processor may be generally arranged to execute one or more software components 522-a. The processor can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel®, Atom Celeron®, Core (2) Duo®, Core i3, Core i5, Core i7, Pentium®, Xeon®, Xeon Phi®, Itanium® and XScale® processors; and similar processors. Multi-core processors and other multi-processor architectures may also be employed to implement apparatus 500.

According to some examples, apparatus 500 may include an information component 522-1. Information component 522-1 may be executed by circuitry 520 to receive information to indicate a row hammer limit "T" for DRAM having a given activate rate to rows for the DRAM (e.g., a maximum activate rate). For these examples, T may be received via row hammer limit 505 and the activate rate may be received via ACT rate 510. Row hammer limit 505 and maximum ACT rate 510 may have been received from an SPD table maintained at or with the DRAM have T and the activate rate. Information component 522-1 may be capable of storing the received values with row hammer limit 524-a and ACT rate 525-b. Row hammer limit 524-a and ACT rate 525-b may be maintained in a data structure such as a lookup table (LUT).

In some examples, apparatus 500 may also include a probabilistic component 522-2. Probabilistic component 522-2 may be executed by circuitry 520 to determine a probabilistic row hammer detection value "P" that selects a given activation to a given aggressor row from among the DRAM rows for a pTRR to one or more victim rows from among the DRAM rows associated with the given aggressor row. For these examples, P may be based on a first probability that the given activation causes the T to be exceeded for the given aggressor row before a scheduled row refresh is performed on the one or more victim rows. Also, P may be based on a maximum FIT rate that may have been received via maximum FIT rate 515. Probabilistic component 522-2 may be capable of maintaining one or more values for P in probabilistic row hammer detection value(s) 526-c (e.g., in a LUT).

According to some examples, apparatus 500 may also include a random number component 522-3. Random number component 522-3 may be executed by circuitry 520 to cause a random number to be generated following a first activation to a first aggressor row. For these examples, the first activation may have been detected upon receipt of aggressor ACT 535. Random number component 522-3 may be capable of at least temporarily storing the generated random number in random number 527-*d* (e.g., in a LUT).

In some examples, apparatus 500 may also include a compare component 522-4. Compare component 522-4 may be executed by circuitry 520 to compare the random number at least temporarily stored by random number component 522-3 with random number 527-*d* with an expected number. For these examples, the expected number may be based on evaluation information 528-*e* (e.g., Table III) for which compare component 522-4 may use to determine the expected number and compare that number to the random umber. As described more below, the results of the comparison may determine whether or not a pTRR 540 is sent to one or more victim rows.

According to some examples, apparatus 500 may also include a count component 522-5. Count component 522-5 may be executed by circuitry 520 to decrement the random number at least temporarily stored by random number component 522-3. The random number may be decrement for each subsequent activation to any aggressor rows until the random number is decrement to zero. In other examples, count component 522-5 may determine, responsive to the activation first received via aggressor ACT 535, a total number of separate activation to any aggressor row for the DRAM following sending of a last pTRR to any victim row. For either of these examples, count component 522-5 may maintain either the decremented counts or the total counts with count information 529-*f* (e.g., in a LUT).

In some examples, apparatus 500 may also include a select component 522-6. Select component 522-6 may be executed by circuitry 520 to select the given activation to the given aggressor row based on the given activation being the activation that caused the decremented random number to be decremented to zero by count component 522-5.

According to some examples, apparatus 500 may also include a target component 522-7. Target component 522-7 may be executed by circuitry 520 to cause the pTRR to be sent to one or more victim rows associated with the given aggressor row based on the comparisons mad by compare component 522-4. In some examples, the pTRR 540 may be sent such that separate pTRRs to a multitude of victim rows associated with respective aggressor rows are sent at an average activate rate for the respective aggressors that approximately equals the value for P maintained by probabilistic component 522-3. In other examples, target component 522-7 may cause pTRR 540 to be sent to one or more victim rows associated with the given aggressor based on the total number counted by count component 522-5 matching the value for P. For either example, target component 522-7 may use victim information 530-*g* (e.g., maintained in a LUT) to determine what physical address to send pTRR 540 to the one or more victim rows.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 6:
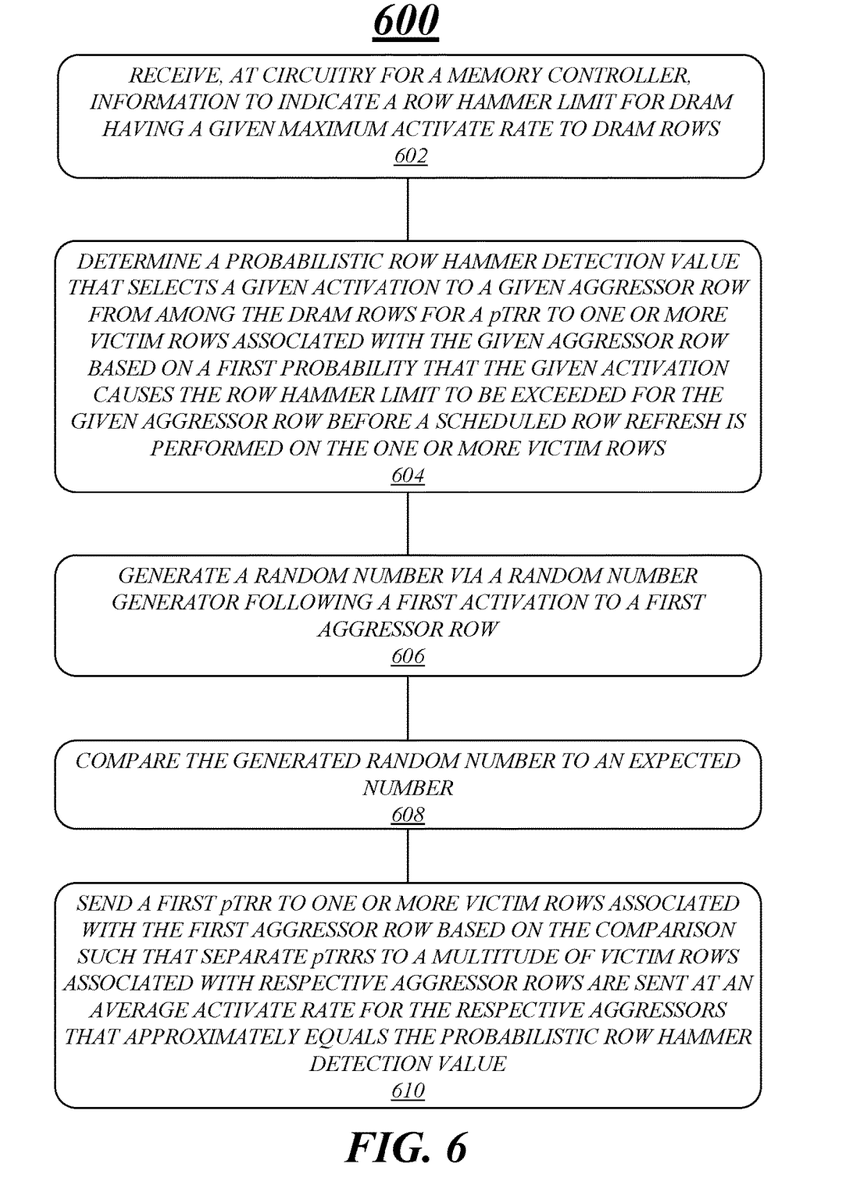
FIG. 6 illustrates an example logic flow.

FIG. 6 illustrates a logic flow 600. Logic flow 600 may be representative of some or all of the operations executed by one or more logic, features, or devices described herein, such as apparatus 500. More particularly, logic flow 600 may be implemented by information component 522-1, probabilistic component 522-2, random number component 522-3, compare component 522-4, count component 522-5, select component 522-6 or target component 522-7.

According to some examples, logic flow 600 at block 602 may receive, at circuitry for a memory controller, information to indicate a row hammer limit "T" for DRAM having a given activate rate to DRAM rows. In some examples, information component 522-1 may be capable of receiving this information from an SPD table located at or with the DRAM.

In some examples, logic flow 600 at block 604 may determine a probabilistic row hammer detection value "P" that selects a given activation to a given aggressor row from among the DRAM rows for a pTRR to one or more victim rows associated with the given aggressor row based on a first probability that the given activation causes T to be exceeded for the given aggressor row before a scheduled row refresh is performed on the one or more victim rows. For these examples, probabilistic component 522-2 may be capable of determining the value for P.

According to some examples, logic flow 600 at block 606 may generate a random number via a random number generator following a first activation to a first aggressor row. For these examples, random number component 522-3 may cause the random number to be generated.

In some examples, logic flow 600 at block 608 may compare the generated random number to an expected number. For these examples, compare component 522-4 may make the comparison.

According to some examples, logic flow at block 610 may send a first pTRR to one or more victim rows associated with the first aggressor row based on the comparison such that separate pTRRs to a multitude of victim rows associated with respective aggressor rows are sent at an average activate rate for the respective aggressors that approximately equals the probabilistic row hammer detection value. For these examples, target component 522-7 may cause the pTRR to be sent.

Figure 7:
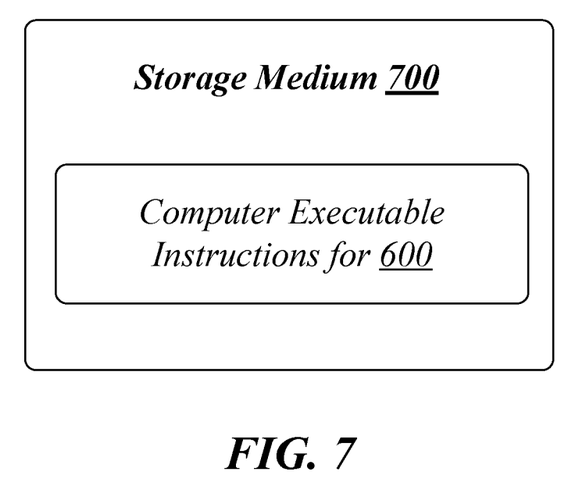
FIG. 7 illustrates an example storage medium.

FIG. 7 illustrates an embodiment of a storage medium 700. The storage medium 700 may comprise an article of manufacture. In some examples, storage medium 700 may include any non-transitory computer readable medium or machine readable medium, such as an optical, magnetic or semiconductor storage. Storage medium 700 may store various types of computer executable instructions, such as instructions to implement logic flow 600. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 8:
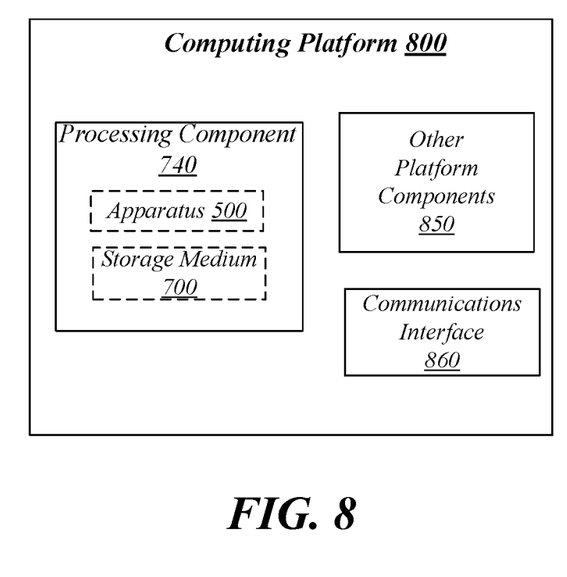
FIG. 8 illustrates an example computing platform.

FIG. 8 illustrates an example computing device 800. In some examples, as shown in FIG. 8, computing device 800 may include a processing component 840, other platform components 850 or a communications interface 860.

According to some examples, processing component 840 may execute processing operations or logic for apparatus 500 and/or storage medium 700. Processing component 840 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 850 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 850 may include without limitation, various types of computer readable and machine readable storage media in the form of one or more higher speed memory units, such as ROM, RAM, DRAM, Double-Data-Rate DRAM (DDRAM), synchronous DRAM (SDRAM), SRAM, programmable ROM (PROM), EPROM, EEPROM, NAND flash memory, NOR flash memory, polymer memory such as ferroelectric polymer memory, ferroelectric transistor random access memory (FeTRAM or FeRAM), nanowire, ovonic memory, ferroelectric memory, 3-dimensional cross-point memory, SONOS memory, magnetic or optical cards, an array of devices such as Redundant Array of Independent Disks (RAID) drives, solid state memory devices (e.g., USB memory), SSDs and any other type of storage media suitable for storing information.

In some examples, communications interface 860 may include logic and/or features to support a communication interface. For these examples, communications interface 860 may include one or more communication interfaces that operate according to various communication protocols or standards to communicate over direct or network communication links. Direct communications may occur via use of communication protocols or standards described in one or more industry standards (including progenies and variants) to include the Peripheral Component Interconnect (PCI) Express Base Specification, revision 3.0, published in November 2010 ("PCI Express" or "PCIe"), the Universal Serial Bus Specification, revision 3.0, published in November 2008 ("USB"), the Serial ATA (SATA) Specification, revision 3.1, published in July 2001, Request for Comments (RFC) 3720, Internet Small Computer System Interface (iSCSI), published in April 2004 and/or the Serial Attached SCSI (SAS) Specification, revision 2.1, published in December 2010. Network communications may occur via use of various communication protocols and may operate in compliance with one or more promulgated standards or specifications for wired or wireless networks by the Institute of Electrical Engineers (IEEE). These standards are specifications may include, but are not limited to, IEEE 802.11-2012 Standard for Information technology—Telecommunications and information exchange between systems—Local and metropolitan area networks—Specific requirements Part 11: WLAN Media Access Controller (MAC) and Physical Layer (PHY) Specifications, published March 2012, later versions of this standard ("IEEE 802.11") for wireless mediums or IEEE 802.3-2008, Carrier sense Multiple access with Collision Detection (CSMA/CD) Access Method and Physical Layer Specifications, Published in December 2008 (hereinafter "IEEE 802.3") for wired mediums, one or more protocols that may encapsulate Fibre Channel frames over Ethernet networks referred to as fiber channel over Ethernet (FCoE), compatible with the protocols described by the American National Standard of Accredited Standards Committee INCITS T11 Technical Committee, Fibre Channel Backbone-5 (FC-BB-5) Standard, Revision 2.0, published June 2009 and/or protocols associated with RFC 3530, Network File System (NFS), version 4 Protocol, published in April 2003.

Computing device 800 may be part of a system or device that may be, for example, user equipment, a computer, a personal computer (PC), a desktop computer, a laptop computer, a notebook computer, a netbook computer, a tablet computer, a tablet, a portable gaming console, a portable media player, a smart phone, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing device 800 described herein, may be included or omitted in various embodiments of computing device 800, as suitably desired.

The components and features of computing device 800 may be implemented using any combination of discrete circuitry, application specific integrated circuits (ASICs), logic gates and/or single chip architectures. Further, the features of computing device 800 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing device 800 shown in the block diagram of FIG. 8 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

In some examples, an example apparatus may include circuitry and an information component for execution by the circuitry to receive information that may indicate a row hammer limit for DRAM having a given activate rate to rows for the DRAM. The apparatus may also include a probabilistic component for execution by the circuitry that may determine a probabilistic row hammer detection value that selects an activation to an aggressor row of the DRAM rows that causes a pTRR to one or more victim rows of the DRAM rows associated with the aggressor row based on a first probability that the activation causes the row hammer limit to be exceeded for the aggressor row before a scheduled row refresh is performed on the one or more victim rows.

According to some examples for the apparatus, the first probability may be determined by the probabilistic module based on $$\left(1 - \frac{1}{P}\right)^T,$$

where "T" equates to the row hammer limit and "P" equates to the probabilistic row hammer detection value.

In some examples for the apparatus, the probabilistic row hammer detection value may be determined by the probabilistic module based on a first product of the first probability multiplied by the given activate rate. The probabilistic row hammer detection value may also be determined based on a second product of a number of scheduled row refreshes in a time of 1 hour multiplied by the first product to determine a one-hour failure in time (FIT) rate. The probabilistic row hammer detection value may also be determined based on a third product of the one-hour FIT rate by 1,000,000,000 to determine a billion-hour FIT rate. The probabilistic row hammer detection value may also be determined based on adjusting the probabilistic row hammer detection value such that the billion-hour FIT rate value is less than a value of 1.

According to some examples for the apparatus, the scheduled row refresh may be arranged to occur every 64 milliseconds while the DRAM is an operating state.

In some examples, the apparatus may also include a random number component for execution by the circuitry to cause a random number to be generated following a first activation to a first aggressor row. The apparatus may also include a comparison component for execution by the circuitry to compare the generated random number to an expected number and a target component for execution by the circuitry to cause a first pTRR to be sent to one or more victim rows associated with the first aggressor row. The first pTRR may be sent based on the comparison such that separate pTRRs to a multitude of victim rows associated with respective aggressor rows are sent at an average activate rate for the respective aggressor rows that approximately equals the probabilistic row hammer detection value.

According to some examples for the apparatus, the random number component may cause the random number to be generated by an LFSR that may be capable of generating a pseudo random number for the generated random number.

In some examples, the apparatus may also include a random number component for execution by the circuitry to cause a random number to be generated following a first activation to the a first aggressor row. The apparatus may also include a count component for execution by the circuitry to decrement the random number for each subsequent activation to any aggressor rows until the random number is decremented to zero. The apparatus may also include a select component for execution by the circuitry to select the first activation to the first aggressor row based on the first activation being the subsequent activation that caused the random number to be decremented to zero and a target component for execution by the circuitry to cause a first pTRR to be sent to one or more victim rows associated with the first aggressor row.

According to some examples for the apparatus, the random number component may cause the random number to be generated by an LFSR that may be capable of generating a pseudo random number for the generated random number.

In some examples, the apparatus may also include a random number component for execution by the circuitry to cause a random number to be generated following a first activation to a first aggressor row. The apparatus may also include a count component for execution by the circuitry to determine, responsive to the activation to the first aggressor row, a total number of separate activations to any aggressor row for the DRAM following sending of a last pTRR to any victim row. The apparatus may also include a compare component for execution by the circuitry to compare the total number to the probabilistic row hammer detection value and a target component for execution by the circuitry to cause a first pTRR to be sent to one or more victim rows associated with the first aggressor row based on the total number matching the probabilistic row hammer detection value.

According some examples for the apparatus, the DRAM may be included in a DIMM and the DRAM may include DDR DRAM that includes DDR3 DRAM or DDR4 DRAM.

In some examples, an example method may include receiving, at circuitry for a memory controller, information to indicate a row hammer limit for dynamic random access memory (DRAM) having a given activate rate to DRAM rows. The method may also include determining a probabilistic row hammer detection value that selects an activation to a given aggressor row of the DRAM rows that causes a pTRR to one or more victim rows associated with the aggressor row based on a first probability that the activation causes the row hammer limit to be exceeded for the aggressor row before a scheduled row refresh is performed on the one or more victim rows.

According to some examples for the method, the first probability may be determined based on $$\left(1 - \frac{1}{P}\right)^T,$$

where "T" equates to the row hammer limit and "P" equates to the probabilistic row hammer detection value.

In some examples for the method, determining the probabilistic row hammer detection value may also include multiplying the first probability by both the given activate rate and a number of scheduled row refreshes in a time of 1 hour to determine a 1-hour FIT rate. Determining the probabilistic row hammer detection value may also include multiplying the one-hour FIT rate by 1,000,000,000 to determine a billion-hour FIT rate. Determining the probabilistic row hammer detection value may also include adjusting the probabilistic row hammer detection value such that the billion-hour FIT rate value is less than a value of 1.

According to some examples for the method, the scheduled row refresh may be performed every 64 millisecond while the DRAM is in an operating state.

In some examples, the method may also include generating a random number via a random number generator following a first activation to a first aggressor row. The method may also include comparing the generated random number to an expected number. The method may also include sending a first pTRR to one or more victim rows associated with the first aggressor row based on the comparison such that separate pTRRs to a multitude of victim rows associated with respective aggressor rows are sent at an average activate rate for the respective aggressors rows that approximately equals the probabilistic row hammer detection value.

According to some examples for the method, generating the random number may be such that the random number generator is arranged to generate a random number around a median value that maintains a minimum interval between sending subsequent pTRRs to victim rows associated with given aggressor rows.

In some examples for the method, the random number generator may include an LFSR that generates a pseudo random number for the generated random number.

According to some examples, the method may also include generating a random number via a random number generator following a first activation to a first aggressor row, the random number generated such that a range of numbers having an average value that approximately equals the probabilistic row hammer detection value are generated. The method may also include decrementing the random number for each subsequent activation to any aggressor rows until the random number is decremented to zero. The method may also include selecting the first activation to the first aggressor row based on the first activation being the subsequent activation that caused the random number to be decremented to zero. The method may also include sending a first pTRR to one or more victim rows associated with the first aggressor row.

In some examples for the method, the random number generator may include an LFSR that generates a pseudo random number for the random number.

According to some examples, the method may also include determining, responsive to a first activation to a first aggressor row, a total number of separate activations to any aggressor row for the DRAM following sending of a last pTRR to any victim row. The method may also include comparing the total number to the probabilistic row hammer detection value. The method may also include sending a first pTRR to one or more victim rows associated with the first aggressor row based on the total number matching the probabilistic row hammer detection value.

In some examples for the method, the DRAM may be included in a DIMM controlled by the memory controller.

According to some examples for the method, the information received to indicate the row hammer limit may also indicate that the row hammer limit is provided by a manufacturer of the DRAM included in the DIMM.

In some examples for the method, the DRAM may include DDR DRAM including DDR3 or DDR4.

According to some examples, an example at least one machine readable medium including a plurality of instructions that in response to being executed by a controller for accessing DRAM cause the controller to receive information to indicate a row hammer limit for the DRAM that has a given activate rate to DRAM rows. The instructions may also cause the controller to determine a probabilistic row hammer detection value that selects an activation to an aggressor row of the DRAM rows that causes a pTRR to one or more victim rows associated with the aggressor row based on a first probability that the activation causes the row hammer limit to be exceeded for the aggressor row before a scheduled row refresh is performed on the one or more victim rows.

In some examples for the at least one machine readable medium, the first probability may be determined based on $$\left(1 - \frac{1}{P}\right)^T,$$

where "T" equates to the row hammer limit and "P" equates to the probabilistic row hammer detection value.

According to some examples for the at least one machine readable medium, the instructions to also cause the controller to determine the probabilistic row hammer detection value based on a first product of the first probability multiplied by the given activate rate, a second product of a number of scheduled row refreshes in a time of 1 hour multiplied by the first product to determine a one-hour FIT rate, a third product of the one-hour FIT rate by 1,000,000,000 to determine a billion-hour FIT rate and adjust the probabilistic row hammer detection value such that the billion-hour FIT rate value is less than a value of 1.

In some examples for the at least one machine readable medium, the scheduled row refresh may be arranged to occur every 64 milliseconds while the DRAM is an operating state.

According some examples for the at least one machine readable medium, the instructions may also cause the controller to generate a random number via a random number generator following a first activation to a first aggressor row, compare the generated random number to an expected number and then send a first pTRR to one or more victim rows associated with the first aggressor row based on the comparison such that separate pTRRs to a multitude of victim rows associated with respective aggressor rows are sent at an average activate rate for the respective aggressor rows that approximately equals the probabilistic row hammer detection value.

In some examples for the at least one machine readable medium, the instructions may also cause the controller to generate a random number via a random number generator following a first activation to a first aggressor row, the random number generated such that a range of numbers having an average value that approximately equals the probabilistic row hammer detection value are generated. The instructions may also cause the controller to decrement the random number for each subsequent activation to any aggressor rows until the random number is decremented to zero. The instructions may also cause the controller to select the first activation to the first aggressor row based on the first activation being the subsequent activation that caused the random number to be decremented to zero and send the first pTRR to one or more victim rows associated with the first aggressor row.

According to examples for the at least one machine readable medium, the instructions may also cause the controller to determine, responsive to a first activation to a first aggressor row, a total number of separate activations to any aggressor row for the DRAM following sending of a last pTRR to any victim row. The instruction may also cause the controller to compare the total number to the probabilistic row hammer detection value and send a first pTRR to one or more victim rows associated with the first aggressor row based on the total number matching the probabilistic row hammer detection value.

In examples for the at least one machine readable medium, the DRAM may be included in a DIMM and the DRAM may be DDR DRAM that includes DDR3 DRAM or DDR4 DRAM.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
    logic for one or more memory devices, at least a portion of the logic in hardware, the logic to:
        receive information to indicate a row hammer limit for dynamic random access memory (DRAM) included in the one or more memory devices, the DRAM having a given activate rate to rows for the DRAM;
        determine a row hammer detection value that selects an activation to an aggressor row of the DRAM rows that causes a targeted row refresh (TRR) to one or more victim rows of the DRAM rows associated with the aggressor row based on a probability that the activation causes the row hammer limit to be exceeded for the aggressor row before a scheduled row refresh is performed on the one or more victim rows;

cause a random number to be generated following a first activation to a first aggressor row;

decrement the random number for each subsequent activation to any aggressor rows until the random number is decremented to zero;

select the first activation to the first aggressor row based on the first activation being the subsequent activation that caused the random number to be decremented to zero; and cause a first TRR to be sent to one or more victim rows associated with the first aggressor row.

2. The apparatus of claim 1, wherein the logic is further to determine the probability based on $$\left(1 - \frac{1}{P}\right)^T,$$

where "T" equates to the row hammer limit and "P" equates to the row hammer detection value.

3. The apparatus of claim 2, wherein the logic is further to determine the row hammer detection value based on:
a first product of the probability multiplied by the given activate rate;
a second product of a number of scheduled row refreshes in a time of 1 hour multiplied by the first product to determine a one-hour failure in time (FIT) rate;
a third product of the one-hour FIT rate by 1,000,000,000 to determine a billion-hour FIT rate value; and
adjust the row hammer detection value such that the billion-hour FIT rate value is less than a value of 1.

4. The apparatus of claim 1, comprising the scheduled row refresh arranged to occur every 64 milliseconds while the DRAM is an operating state.

5. The apparatus of claim 1, wherein the logic is further to:
compare the generated random number to an expected number; and
cause a first TRR to be sent to one or more victim rows associated with the first aggressor row based on the comparison such that separate TRR to a multitude of victim rows associated with respective aggressor rows are sent at an average activate rate for the respective aggressor rows that approximately equals the row hammer detection value.

6. The apparatus of claim 5, wherein the logic is further to cause the random number to be generated by a linear shift feedback register (LFSR) that is capable of generating a pseudo random number for the generated random number.

7. The apparatus of claim 1, wherein the logic is further to cause the random number to be generated by a linear shift feedback register (LFSR) arranged to generate a pseudo random number for the generated random number.

8. The apparatus of claim 1, wherein the logic is further to:
determine, responsive to the activation to the first aggressor row, a total number of separate activations to any aggressor row for the DRAM following sending of a last TRR to any victim row;
compare the total number to the row hammer detection value; and
cause a first TRR to be sent to one or more victim rows associated with the first aggressor row based on the total number matching the row hammer detection value.

9. The apparatus of claim 1, comprising the one or more memory devices included in a dual in-line memory module (DIMM) and the DRAM included in the one or more memory devices is double data rate (DDR) DRAM including DDR3 DRAM or DDR4 DRAM.

10. A method comprising:
receiving, at circuitry for controlling one or more memory devices, information to indicate a row hammer limit for dynamic random access memory (DRAM) included in the one or more memory devices, the DRAM having a given activate rate to DRAM rows;
determining a row hammer detection value that selects an activation to an aggressor row of the DRAM rows that causes a targeted row refresh (TRR) to one or more victim rows associated with the aggressor row based on a probability that the activation causes the row hammer limit to be exceeded for the aggressor row before a scheduled row refresh is performed on the one or more victim rows;
generating a random number via a random number generator following a first activation to a first aggressor row, the random number generated such that a range of numbers having an average value that approximately equals the row hammer detection value are generated;
decrementing the random number for each subsequent activation to any aggressor rows until the random number is decremented to zero;
selecting the first activation to the first aggressor row based on the first activation being the subsequent activation that caused the random number to be decremented to zero; and
sending a first TRR to one or more victim rows associated with the first aggressor row.

11. The method of claim 10, comprising the probability determined based on $$\left(1 - \frac{1}{P}\right)^T,$$

where T equates to the row hammer limit and "P" equates to the row hammer detection value.

12. The method of claim 11, determining the row hammer detection value further comprising:
multiplying the probability by both the given activate rate and a number of scheduled row refreshes in a time of 1 hour to determine a one-hour failure in time (FIT) rate;
multiplying the one-hour FIT rate by 1,000,000,000 to determine a billion-hour FIT rate value; and
adjusting the row hammer detection value such that the billion-hour FIT rate value is less than a value of 1.

13. The method of claim 10, comprising:
comparing the generated random number to an expected number; and
sending a first TRR to one or more victim rows associated with the first aggressor row based on the comparison such that separate TRR to a multitude of victim rows associated with respective aggressor rows are sent at an average activate rate for the respective aggressors rows that approximately equals the row hammer detection value.

14. The method of claim 13, comprising generating the random number such that the random number generator is arranged to generate a random number around a median value that maintains a minimum interval between sending subsequent TRR to victim rows associated with given aggressor rows.

15. The method of claim 10, comprising:
   determining, responsive to a first activation to a first aggressor row, a total number of separate activations to any aggressor row for the DRAM following sending of a last TRR to any victim row;
   comparing the total number to the row hammer detection value; and
   sending a first TRR to one or more victim rows associated with the first aggressor row based on the total number matching the row hammer detection value.

16. The method of claim 10, comprising the one or more memory devices included in a dual in-line memory module (DIMM).

17. The method of claim 16, comprising the information to indicate the row hammer limit is provided by a manufacturer of the DRAM included in the one or more memory devices.

18. At least one non-transitory machine readable medium comprising a plurality of instructions that in response to being executed by a system for accessing one or more memory devices causes the system to:
   receive information to indicate a row hammer limit for dynamic random access memory (DRAM) included in the one or more memory devices, the DRAM to have a given activate rate to DRAM rows;
   determine a row hammer detection value that selects an activation to an aggressor row of the DRAM rows that causes a targeted row refresh TRR to one or more victim rows associated with the aggressor row based on a probability that the activation causes the row hammer limit to be exceeded for the aggressor row before a scheduled row refresh is performed on the one or more victim rows;
   generate a random number via a random number generator following a first activation to a first aggressor row, the random number generated such that a range of numbers having an average value that approximately equals the row hammer detection value are generated;
   decrement the random number for each subsequent activation to any aggressor rows until the random number is decremented to zero;
   select the first activation to the first aggressor row based on the first activation being the subsequent activation that caused the random number to be decremented to zero; and
   send a first TRR to one or more victim rows associated with the first aggressor row.

19. The at least one non-transitory machine readable medium of claim 18, comprising the probability determined based on $$\left(1 - \frac{1}{P}\right)^T,$$

where "T" equates to the row hammer limit and "P" equates to the row hammer detection value.

20. The at least one non-transitory machine readable medium of claim 19, comprising the instructions to also cause the system to determine the row hammer detection value based on:
   a first product of the probability multiplied by the given activate rate;
   a second product of a number of scheduled row refreshes in a time of 1 hour multiplied by the first product to determine a one-hour failure in time (FIT) rate;
   a third product of the one-hour FIT rate by 1,000,000,000 to determine a billion-hour FIT rate value; and
   adjust the row hammer detection value such that the billion-hour FIT rate value is less than a value of 1.

21. The at least one non-transitory machine readable medium of claim 18, comprising the instructions to also cause the system to:
   compare the generated random number to an expected number; and
   send a first TRR to one or more victim rows associated with the first aggressor row based on the comparison such that separate TRR to a multitude of victim rows associated with respective aggressor rows are sent at an average activate rate for the respective aggressor rows that approximately equals the row hammer detection value.

22. The at least one non-transitory machine readable medium of claim 18, comprising the instructions to also cause the system to:
   determine, responsive to a first activation to a first aggressor row, a total number of separate activations to any aggressor row for the DRAM following sending of a last TRR to any victim row;
   compare the total number to the row hammer detection value; and
   send a first TRR to one or more victim rows associated with the first aggressor row based on the total number matching the row hammer detection value.

23. The at least one non-transitory machine readable medium of claim 18, comprising one or more memory devices included in a dual in-line memory module (DIMM) and the DRAM included in the one or more memory devices is double data rate (DDR) DRAM including DDR3 DRAM or DDR4 DRAM.

* * * * *